US012743886B2

(12) United States Patent
Takeuchi et al.

(10) Patent No.: US 12,743,886 B2
(45) Date of Patent: Sep. 22, 2026

(54) COMPONENT MOUNTING SYSTEM, IMAGE PROCESSING DEVICE, IMAGE PROCESSING METHOD, AND IMAGE PROCESSING SYSTEM

(71) Applicant: FUJI CORPORATION, Chiryu (JP)

(72) Inventors: Shinya Takeuchi, Toyoake (JP); Katsushi Ota, Anjo (JP)

(73) Assignee: FUJI CORPORATION, Chiryu (JP)

( * ) Notice: Subject to any disclaimer, the term of this patent is extended or adjusted under 35 U.S.C. 154(b) by 344 days.

(21) Appl. No.: 18/559,575

(22) PCT Filed: Jun. 29, 2021

(86) PCT No.: PCT/JP2021/024564

§ 371 (c)(1),
(2) Date: Nov. 8, 2023

(87) PCT Pub. No.: WO2023/275994

PCT Pub. Date: Jan. 5, 2023

(65) Prior Publication Data

US 2024/0273907 A1 Aug. 15, 2024

(51) Int. Cl.
*G06V 20/52* (2022.01)
*G06V 10/12* (2022.01)
*H05K 13/08* (2006.01)

(52) U.S. Cl.
CPC .............. *G06V 20/52* (2022.01); *G06V 10/12* (2022.01); *H05K 13/081* (2018.08); *G06V 2201/07* (2022.01)

(58) Field of Classification Search
CPC .... G06V 20/52; G06V 10/12; G06V 2201/07; H05K 13/081; H05K 13/0882
See application file for complete search history.

(56) References Cited

U.S. PATENT DOCUMENTS

2017/0061365 A1* 3/2017 Nonoyama ............ H05K 13/02
2020/0409383 A1* 12/2020 Maunder .............. G05D 1/0246

FOREIGN PATENT DOCUMENTS

CN 112136373 A 12/2020
JP 2017-045402 A 3/2017
(Continued)

OTHER PUBLICATIONS

International Search Report issued Sep. 14, 2021 in PCT/JP2021/024564, filed on Jun. 29, 2021, 2 pages.

*Primary Examiner* — Sumati Lefkowitz
*Assistant Examiner* — Aaron Joseph Sorrin
(74) *Attorney, Agent, or Firm* — Oblon, McClelland, Maier & Neustadt, L.L.P.

(57) ABSTRACT

A component mounting system includes multiple production facilities installed in a component mounting line for mounting a component on a board, an imaging section installed in the component mounting line and configured to image the multiple production facilities and one or multiple workers disposed in the component mounting line, and an image processing section configured to perform image processing on an image captured by the imaging section in a predetermined production period in which a product is produced in the component mounting line. The image processing section is configured to visualize and display, for at least one of the one or multiple workers, a work status of the worker for at least one of the multiple production facilities in each of the multiple points in time or multiple periods set in advance in the production period.

11 Claims, 6 Drawing Sheets

(56) References Cited

FOREIGN PATENT DOCUMENTS

| | | | | | |
|---|---|---|---|---|---|
| JP | 2019191748 | A | * | 10/2019 | |
| JP | 2020-95296 | A | | 6/2020 | |
| JP | 2020095296 | A | * | 6/2020 | |
| WO | WO-2008042322 | A2 | * | 4/2008 | ......... H05K 13/0882 |

* cited by examiner

COMPONENT MOUNTING SYSTEM, IMAGE PROCESSING DEVICE, IMAGE PROCESSING METHOD, AND IMAGE PROCESSING SYSTEM

TECHNICAL FIELD

The present description relates to a component mounting line for mounting a component on a board. More specifically, the present description relates to a technique of visualizing a work status of a worker disposed in the component mounting line.

BACKGROUND ART

Multiple production facilities (for example, a printing machine, a component mounting machine, a reflow oven, a board inspection machine, and the like) are installed in the component mounting line for mounting the component on the board. The board is subsequently conveyed to the multiple production facilities, and predetermined processing is performed on the board in each production facility, so that the component is mounted on the board. In order to mount the component on the board, preparation work (for example, supply of a raw material (component or the like)) is required for each production facility. For this reason, the worker is arranged in the component mounting line, and the worker performs required work in accordance with an operation status of the production facility. In order to increase the production efficiency of the component mounting line, the work status of the worker should be appropriate for the operation status of the production facility. For this reason, a technique of evaluating a work status of a worker is developed (for example, JP-A-2019-191748).

BRIEF SUMMARY

Technical Problem

In the technique of JP-A-2019-191748, a production facility that is an analysis target and the worker who performs work on the production facility are imaged. Then, the operation status of the production facility, and a position and an orientation of the worker are acquired by analyzing the captured image, to determine whether the work of the worker is appropriate for the production facility. In the technique of JP-A-2019-191748, it is possible to evaluate whether the work status of the worker is appropriate for the production facility that is the analysis target, but the multiple production facilities are installed in the component mounting line, and the worker generally performs the work on the multiple production facilities. Therefore, even in a case where the work status is appropriate for a first production facility, the work status is not always appropriate for a second production facility. In the technique of JP-A-2019-191748, it is not possible to evaluate whether the work status of the worker is appropriate for multiple production facilities installed in the component mounting line.

The present description discloses a technique of evaluating whether a work status of a worker is appropriate for multiple production facilities installed in a component mounting line.

Solution to Problem

A component mounting system disclosed in the present description includes multiple production facilities installed in a component mounting line for mounting a component on a board, an imaging section installed in the component mounting line and configured to image the multiple production facilities and one or multiple workers disposed in the component mounting line, and a display section configured to perform image processing on an image captured by the imaging section in a predetermined production period in which a product is produced in the component mounting line, to visualize and display, for at least one of the one or multiple workers, a work status of the worker for at least one of the multiple production facilities in each of the multiple points in time or multiple periods set in advance in the production period.

In the component mounting system described above, the multiple production facilities and the one or multiple workers disposed in the component mounting line are imaged, and the image processing is performed on the captured image to visualize the work status of the worker. By imaging the multiple production facilities, it is possible to evaluate whether the work status of the worker is appropriate for the operation statuses of the multiple production facilities.

DESCRIPTION OF EMBODIMENTS

Figure 1:
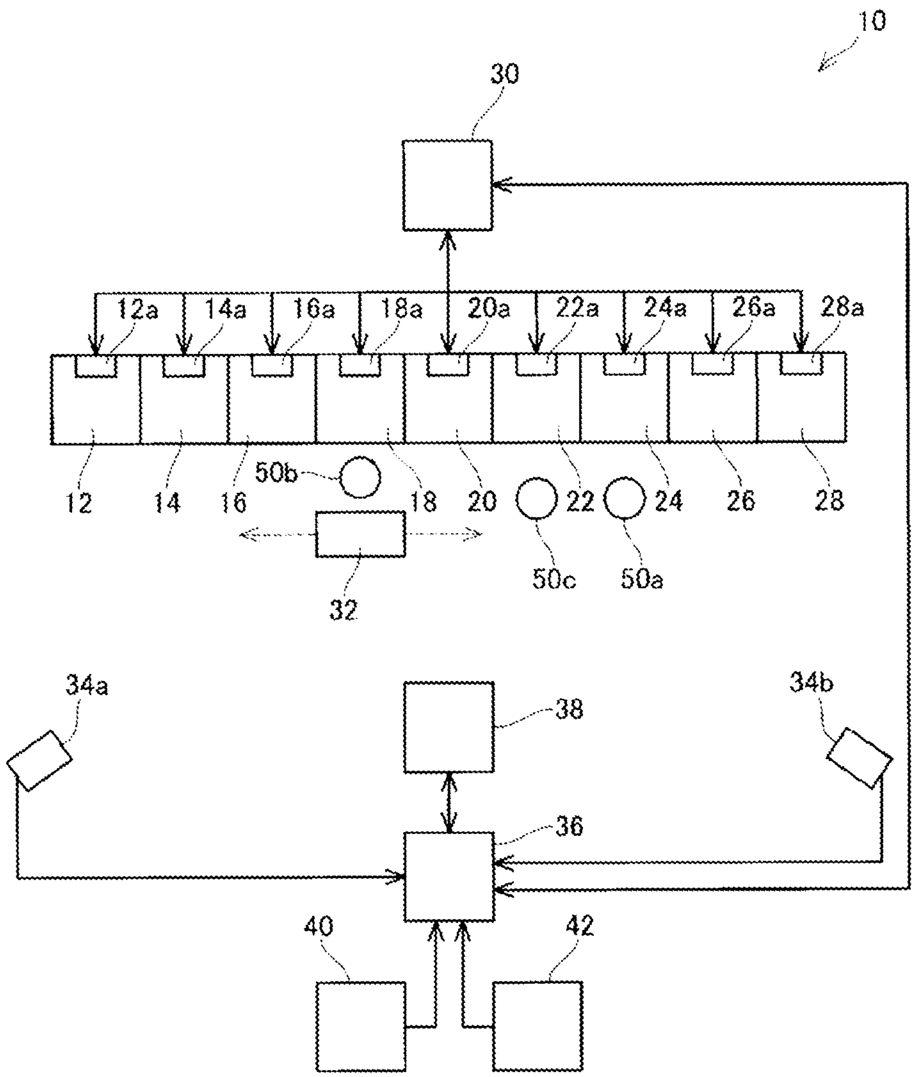
FIG. 1 is a diagram illustrating an overall configuration of a component mounting system.

In the technique disclosed in the present description, the component mounting system may further include an operation status acquisition section configured to acquire an operation status of the at least one of the multiple production facilities in each of the multiple points in time or the multiple periods. The display section may be configured to display the acquired operation status of the production facility in association with the work status. With such a configuration, since the operation status of the production facility and the work status of the worker are displayed in association with each other, it is possible to easily evaluate whether the work status of the worker is appropriate.

In the technique disclosed in the present description, the operation status acquisition section may be configured to acquire the operation status by the image processing. For example, some production facilities include a signal lamp that notifies the worker that specific work is required. In such a case, by imaging the signal lamp together with the production facility when the production facility is imaged, it is possible to acquire the operation status of the production facility.

In the technique disclosed in the present description, the at least one of the multiple production facilities may include a state output section configured to output own state of the production facility. The operation status acquisition section may be configured to acquire the operation status from the state output from the state output section. With such a configuration, it is possible to accurately acquire the operation status of the production facility based on information output from the production facility.

In the technique disclosed in the present description, the component mounting system may further include a determination section configured to determine whether there is delay in work of the worker from transition of the operation status of the production facility and transition of the work status of the worker. With such a configuration, since the determination section determines whether there is the delay in the work of the worker, it is possible to more easily evaluate the work status of the worker.

In the technique disclosed in the present description, the component mounting system may further include a first designation device configured to designate a production facility that is an analysis target from among the multiple production facilities. The operation status acquisition section may be configured to acquire an operation status of the production facility designated by the first designation device. With such a configuration, it is possible to evaluate the work status of the worker for the designated production facility.

In the technique disclosed in the present description, the component mounting system may further include a second designation device configured to designate a worker who is an analysis target from among the one or multiple workers. The display section may be configured to visualize and display a work status of the worker designated by the second designation device. With such a configuration, it is possible to evaluate the work status of the designated worker.

In the image processing disclosed in the present description, when the multiple production facilities are imaged in a vicinity of the worker in any one of the multiple points in time or the multiple periods, a distance between the worker and the production facility may be calculated for each of the multiple production facilities, and it may be determined that the worker performs work for a production facility having a smallest distance among the calculated distances. With such a configuration, even when the multiple production facilities are shown in the captured image, it is possible to specify the production facility on which the worker performs the work.

In the image processing disclosed in the present description, in a case where it is determined that the worker performs the work for the production facility having the smallest distance, when time during which the work is performed for the production facility is shorter than predetermined time, the determination that the worker performs the work for the production facility may be discarded, and when the time during which the work is performed for the production facility is equal to or longer than the predetermined time, the determination that the worker performs the work for the production facility may be maintained. With such a configuration, even when the image of the worker who simply passes in front of the production facility is captured, it is possible to avoid a situation in which it is determined that the worker performs the work on the production facility.

In the image processing disclosed in the present description, in a case where it is determined that the worker performs work for a specific production facility, a content of the work performed on the production facility by the worker may be specified based on an operation status of the specific production facility. With such a configuration, since the content of the work of the worker is specified in consideration of the operation status of the production facility, it is possible to accurately evaluate the work status of the worker.

Example

Hereinafter, component mounting system 10 according to Example 1 will be described with reference to the drawings. As illustrated in FIG. 1, component mounting system 10 includes multiple production facilities 12 to 28 installed in a component mounting line, management device 30 that manages multiple production facilities 12 to 28, imaging devices (34*a* and 34*b*) installed in the component mounting line, and image processing device 36 that performs image processing on images captured by imaging devices (34*a* and 34*b*).

Production facilities 12 to 28 constitute the component mounting line for mounting a component on a board. The component mounting line mounts the component on the board to be loaded and manufactures the board on which the component is mounted. Hereinafter, a board after component mounting may be referred to as a circuit board, and a board before component mounting or during component mounting may be simply referred to as the board. In the component mounting line of the present example, multiple types of circuit boards are manufactured. When the types of the circuit boards are different, the sizes of the boards are different, the patterns of the solder printed on the boards are also different, and the types of the components mounted on the board are also different. Therefore, when the type of the circuit board produced in the component mounting line is changed, setup work (preparation work) is required in each of production facilities 12 to 28. Further, when the production of the circuit board is started in the component mounting line, the board, the solder, the component, and the like are used along with the production of the circuit board, and it is required to replenish the board, the solder, the component, and the like. For this reason, multiple operators 50*a* to 50*c* (an example of a "worker") are disposed in the component mounting line. In the mounting line illustrated in FIG. 1, three operators 50*a* to 50*c* are disposed.

The component mounting line includes board loader 12, printing machine 14, print inspection machine (SPI) 16, first component mounting machine 18, second component mounting machine 20, first board visual inspection machine (AOI) 22, reflow oven 24, second board visual inspection machine (AOI) 26, and board unloader 28. Since a well-known machine used in a well-known component mounting line can be used as production facilities 12 to 28, production facilities 12 to 28 will be briefly described. Board loader 12 loads the board into the component mounting line. Board loader 12 accommodates multiple boards and carries out the accommodated boards one by one to printing machine 14. Printing machine 14 prints the pattern of the solder on the board carried in from board loader 12. The board on which the pattern of the solder is printed is conveyed from printing machine 14 to print inspection machine 16. Print inspection machine 16 inspects whether the pattern of the solder printed on the board is normal. In a case where an abnormality occurs in the printed pattern of the solder (for example, in a case where a printing failure occurs due to clogging of a mask), the board is discarded. On the other hand, in a case where the printed pattern of the solder is normal, the board is carried out from print inspection machine 16 to first component mounting machine 18. First component mounting machine 18 mounts predetermined multiple components on the board carried in from print inspection machine 16. Specifically, multiple component feeders are detachably attached to first component mounting machine 18, and the components supplied from the component feeders are mounted on the board. The board on which the components are mounted by first component mounting machine 18 is carried out to second component mounting machine 20. Similarly to first component mounting machine 18, second component mounting machine 20 mounts predetermined multiple components on the board carried in from first component mounting machine 18. The board on which the components are mounted is carried out to first board visual inspection machine 22. First board visual inspection machine 22 inspects whether the component is normally mounted on the board. In a case where the component is not normally mounted on the board (for example, in a case where the component is mounted on a different place), the board is discarded. On the other hand, in a case where the component is normally mounted on the board, the board is carried out from first board visual inspection machine 22 to reflow oven 24. Reflow oven 24 heats the board carried in to melt the solder, thereby soldering the component to the board. The board carried out from reflow oven 24 is carried in second board visual inspection machine 26. Second board visual inspection machine 26 inspects whether the soldering is performed on the board at a correct position. In a case where the component is not soldered to the board at the correct position (for example, in a case where the component is displaced due to some reasons during heating in reflow oven 24), the board is discarded. On the other hand, in a case where the component is soldered to the board at the correct position, the board is carried out from second board visual inspection machine 22 to board unloader 28. Board unloader 28 carries out the board (that is, the circuit board on which the component is mounted) conveyed from second board visual inspection machine 22 from the component mounting line.

Production facilities 12 to 28 include communication circuits 12*a* to 28*a* (an example of a "state output section"), respectively. Communication circuits 12*a* to 28*a* are communicably connected to management device 30. Each of communication circuits 12*a* to 28*a* outputs state information indicating the states of production facilities 12 to 28 equipped with the communication circuit to management device 30. For example, board loader 12 outputs the number of boards to be accommodated to management device 30. Accordingly, management device 30 can determine whether it is required to replenish board loader 12 with the board. For example, first component mounting machine 18 and second component mounting machine 20 output the number of used components to management device 30 for each type of component. Accordingly, management device 30 can determine whether it is required to replenish first component mounting machine 18 and second component mounting machine 20 with the component.

The component feeders attached to first component mounting machine 18 and second component mounting machine 20 are conveyed by feeder rack 32. That is, the component feeders before use are loaded up on feeder rack 32 at a storage place, which is not illustrated, and is conveyed to first component mounting machine 18 and/or second component mounting machine 20 by the feeder rack. The component feeders used in first component mounting machine 18 and/or second component mounting machine 20 are loaded up on feeder rack 32. The used component feeders loaded up in feeder rack 32 are conveyed to a storage place, which is not illustrated, and the preparation work for the next use is performed.

Management device 30 is configured with a computer including CPU and a memory. Management device 30 controls the production of the circuit board by controlling the operations of production facilities 12 to 28. For example, management device 30 transmits the printed pattern of the solder to print inspection machine 16, and print inspection machine 16 inspects the board based on the received printed pattern. In addition, for example, management device 30 transmits a mounting program (mounting job) that defines the types, a mounting order, and mounting positions of the components to be mounted on first component mounting machine 18 and second component mounting machine 20, and first component mounting machine 18 and second component mounting machine 20 mount the components on the board based on the received mounting program.

Management device 30 determines the operation state of each production facility based on the state information output from each of production facilities 12 to 28. For example, when it is required to exchange the component feeders, first component mounting machine 18 and second component mounting machine 20 output information to that effect to management device 30. Management device 30 can determine that it is required to exchange the component feeders in first component mounting machine 18 and second component mounting machine 20 based on the information output from first component mounting machine 18 and second component mounting machine 20.

Imaging devices (34*a* and 34*b* (an example of an "imaging section")) are arranged in a factory in which the component mounting line is installed. Imaging devices (34*a* and 34*b*) can image multiple production facilities 12 to 28 installed in the component mounting line, multiple workers 50*a* to 50*c* disposed in the component mounting line, and feeder rack 32 used in the component mounting line. Specifically, imaging devices (34*a* and 34*b*) include first camera 34*a* arranged upstream of (on a side of board loader 12 with respect to) the component mounting line and second camera 34*b* arranged downstream of (on a side of board unloader 28 with respect to) the component mounting line. First camera 34*a* is arranged such that an optical axis thereof is inclined with respect to the component mounting line (direction in which production facilities 12 to 28 are arranged), and can image entire production facilities 12 to 28 from the upstream side of the component mounting line. Second camera 34*b* is arranged such that an optical axis thereof is inclined with respect to the component mounting line, and can image entire production facilities 12 to 28 from the downstream side of the component mounting line. When first camera 34*a* and second camera 34*b* image the component mounting line from different directions, the positions (x,y) of operators 50*a* to 50*c* can be specified as described later. First camera 34*a* and second camera 34*b* are connected to image processing device 36. Moving image data captured by first camera 34*a* and second camera 34*b* are input to image processing device 36.

Image processing device 36 is configured with a computer including CPU and a memory. Image processing device 36 can function as a "display section", an "operation status acquisition section", or the like by executing a program (including an image processing program) stored in the memory. First camera 34*a*, second camera 34*b*, and management device 30 are connected to image processing device 36. Each of a moving image captured by first camera 34*a* and a moving image captured by second camera 34*b* is input to image processing device 36, and operation statuses of production facilities 12 to 28 are input from management device 30. Image processing device 36 visualizes work statuses of operators 50*a* to 50*c* based on the input moving images and the input operation statuses of production facilities 12 to 28. The processing performed by image processing device 36 will be described in detail later.

Display device 38, input device 40, and image registration device 42 are further connected to image processing device 36. Display device 38 displays various types of information output from image processing device 36 (for example, a time chart in which the operation statuses of production facilities 12 to 28 or the work statuses of operators 50*a* to 50*c* are visualized). A well-known display can be used as display device 38. Input device 40 can designate (input) a condition of the image processing performed by image processing device 36, or the production facility and the operator that are targets of the image processing. That is, input device 40 is an example of a "first designation device" and an example of a "second designation device". The information input from input device 40 is stored in the memory of image processing device 36. A well-known pointing device, such as a keyboard or a mouse, can be used as input device 40. Image registration device 42 inputs (registers) images (reference images) of production facilities 12 to 28 or operators 50*a* to 50*c* that are recognition targets in the image processing performed by image processing device 36. The reference images input from image registration device 42 are stored in the memory of image processing device 36. A digital camera, a smartphone with a digital camera, a tablet PC with a digital camera, a scanner, or the like can be used as image registration device 42. Image registration device 42 is an example of an "image input section".

Figure 2:
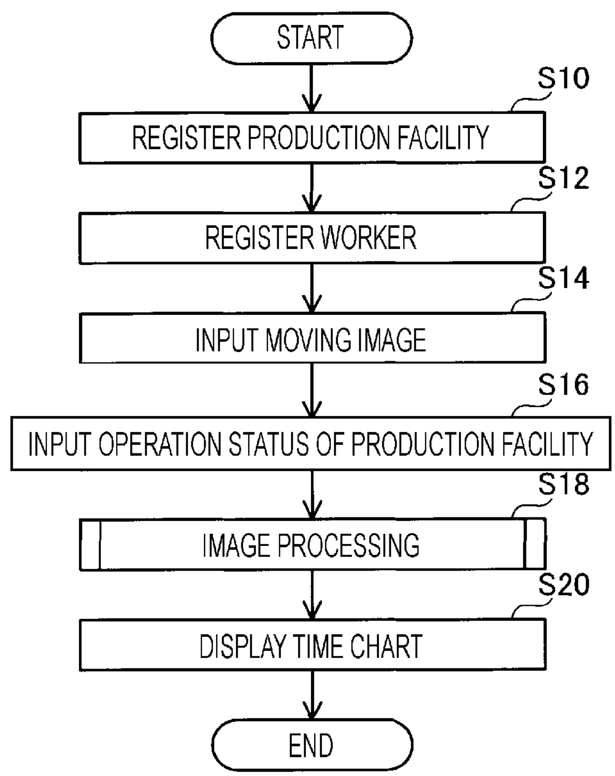
FIG. 2 is a flowchart illustrating processing executed by an image processing device.

Next, the processing executed by image processing device 36 when visualizing the work statuses of operators 50*a* to 50*c* based on the moving images captured by imaging devices (34*a* and 34*b*) will be described. As illustrated in FIG. 2, first, image processing device 36 registers (inputs) the reference images of production facilities 12 to 28 and feeder rack 32 that are the targets of the image processing (S10). In the present example, the reference images of all production facilities 12 to 28 constituting the component mounting line and the reference image of feeder rack 32 used in the component mounting line are input. Image registration device 42 is used to input the reference images.

Next, image processing device 36 registers (inputs) the reference images of operators 50*a* to 50*c* who are the targets of the image processing (S12). In the present example, the reference images of all operators 50*a* to 50*c* disposed in the component mounting line are input. Then, image registration device 42 is used to input the reference image as in S10.

Next, image processing device 36 takes in the moving image data captured by imaging devices (34*a* and 34*b*) (S14). That is, imaging devices (34*a* and 34*b*) image production facilities 12 to 28, feeder rack 32, and operators 50*a* to 50*c* in a predetermined production period in which the circuit board is produced in the component mounting line. The moving image data captured by imaging devices (34*a* and 34*b*) are stored in the memory of imaging devices (34*a* and 34*b*). In S14, the moving image data stored in the memory of imaging devices (34*a* and 34*b*) are input to image processing device 36. A period in which the component mounting line is imaged by imaging devices (34*a* and 34*b*) can be optionally set by a user. For example, operation time (for example, 9:00 a.m. to 5:00 p.m.) of the factory in which the component mounting line is installed may be set as the imaging period, and in a case where the factory in which the component mounting line is installed is in a 24-hour system, one day from a point in time at which the operator is replaced may be set as the imaging period.

Next, image processing device 36 takes in the operation statuses of production facilities 12 to 28 in the period in which the moving images are captured by imaging devices (34*a* and 34*b*) (S16). That is, production facilities 12 to 28 output the state information indicating their own states to management device 30 via communication circuits 12*a* to 28*a*. Therefore, management device 30 acquires operation information (for example, during normal operation, during operation stop (including an error code), during maintenance work, or the like) of the production facility based on the state information output from production facilities 12 to 28, and stores the operation information in the memory. In S16, the operation information of production facilities 12 to 28 stored in the memory of management device 30 is input to image processing device 36.

Next, image processing device 36 creates a time chart in which the work statuses of operators 50*a* to 50*c* are visualized by performing the image processing on the moving image data input in S14 (S18). The image processing in S18 will be described in detail with reference to FIG. 3.

Figure 3:
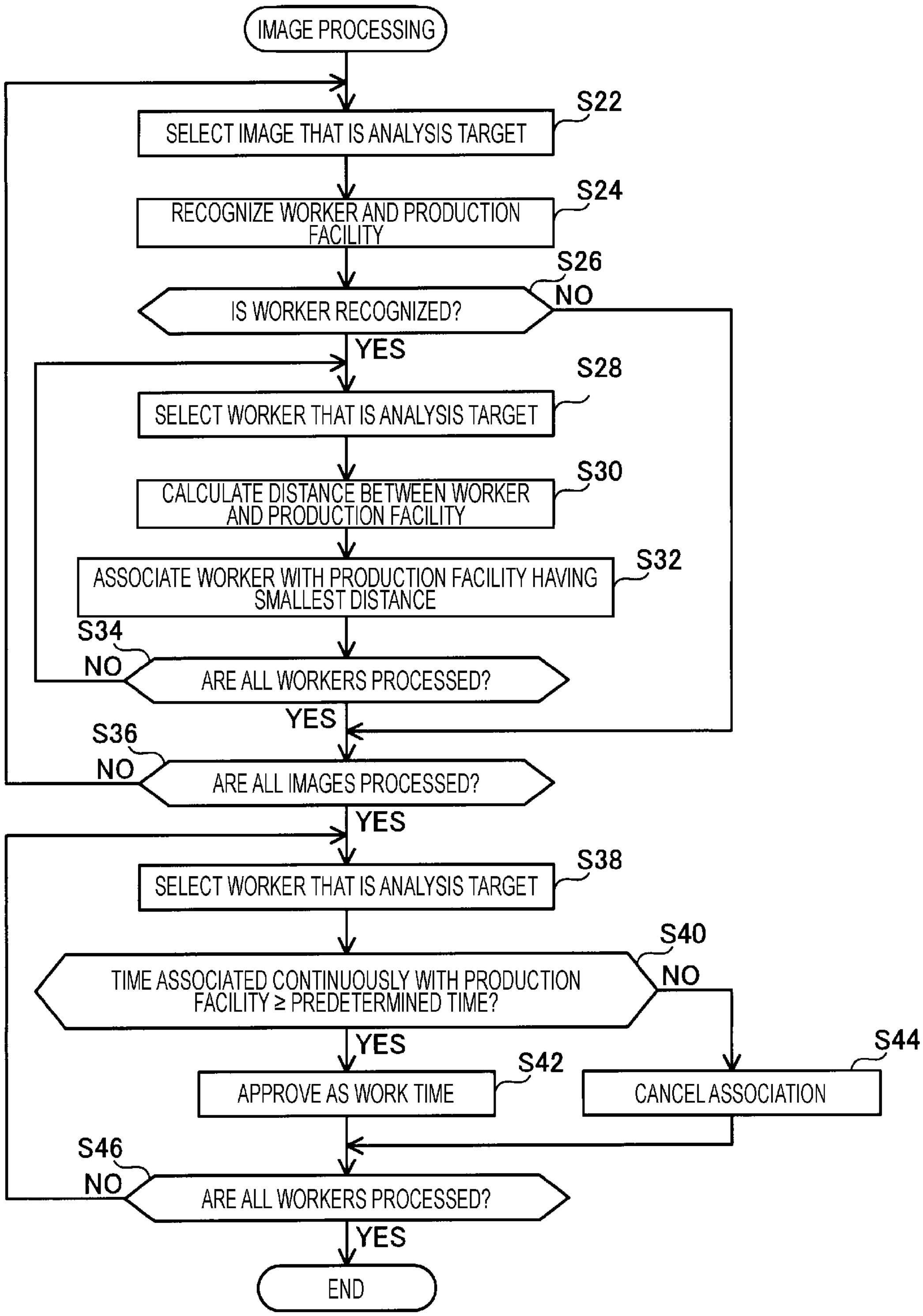
FIG. 3 is a flowchart of image processing executed in S20 of FIG. 2.

As illustrated in FIG. 3, first, image processing device 36 selects image data (one moving image data) that is the target of the image processing (analysis target) from the moving image data input in S14 (S22). That is, imaging devices (34*a* and 34*b*) capture the moving image data at predetermined time intervals (predetermined frame rates). Therefore, the moving image data input in S14 includes multiple image data captured at the predetermined time intervals. In S22, one image data that is the target of the image processing is selected from the multiple image data included in the moving image data. For example, all the image data included in the captured moving image data may be selected and subjected to the image processing. In this case, since all the image data are processed, the work statuses of operators 50*a* to 50*c* can be accurately visualized. On the other hand, only image data selected at a predetermined time interval (that is, a time interval longer than an imaging time interval of imaging devices (34*a* and 34*b*)) from the image data included in the captured moving image data may be subjected to the image processing. In this case, since the number of image data to be subjected to the image processing is reduced, the time required for the image processing can be shortened.

Next, image processing device 36 automatically recognizes whether production facilities 12 to 18 or the like that are the recognition targets are shown in the image data selected in S22 (S24). In the present example, all production facilities 12 to 28 constituting the component mounting line, feeder rack 32 used in the component mounting line, and all operators 50*a* to 50*c* disposed in the component mounting line are the recognition targets. First camera 34*a* and second camera 34*b* of imaging devices (34*a* and 34*b*) are installed to be capable of imaging all production facilities 12 to 28. Therefore, all production facilities 12 to 28 are shown in the moving image data captured by first camera 34*a* and second camera 34*b*. On the other hand, feeder rack 32 may be located outside an imaging range of imaging devices (34*a* and 34*b*), and operators 50*a* to 50*c* may also be located outside the imaging range of imaging devices (34*a* and 34*b*). Accordingly, in S24, production facilities 12 to 28 shown in the image data selected in S22 are recognized, and when feeder rack 32 or operators 50*a* to 50*c* are located within the imaging range of imaging devices (34*a* and 34*b*), feeder rack 32 or operators 50*a* to 50*c* are recognized. A well-known automatic recognition program can be used as a method of automatically recognizing whether a recognition target object is shown in image data.

Next, image processing device 36 determines whether any one of operators 50*a* to 50*c* is recognized in S24 (S26). In a case where image processing device 36 does not recognize any of operators 50*a* to 50*c* (that is, in a case where none of operators 50*a* to 50*c* is present in the component mounting line), NO is determined in S26, and the processing proceeds to S36.

In a case where image processing device 36 recognizes any one of operators 50*a* to 50*c* (that is, in a case where any one of operators 50*a* to 50*c* is present in the component mounting line (YES in S26)), the processing proceeds to S28, and one recognized operator is selected. For example, in a case where three operators 50*a* to 50*c* are recognized, one person who is the analysis target is selected from among operators 50*a* to 50*c*.

Figure 4:
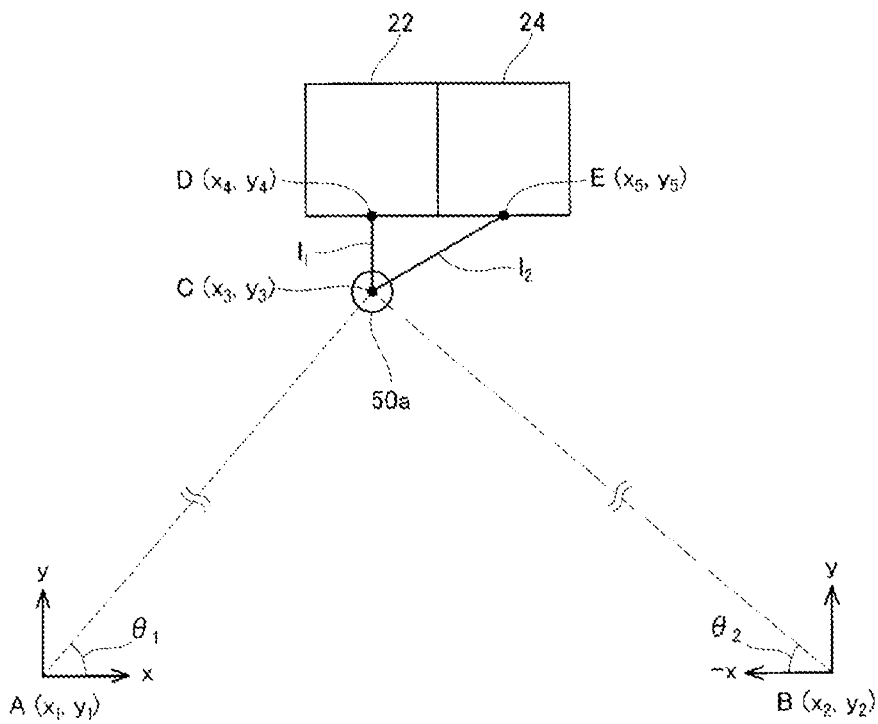
FIG. 4 is a diagram illustrating a procedure for calculating a distance between an operator and a production facility.

Next, image processing device 36 calculates a distance between the operator selected in S28 and each of production facilities 12 to 28 (S30). A procedure for calculating the distance between the operator and the production facility will be described with reference to FIG. 4. FIG. 4 illustrates operator 50*a* and production facilities 22 and 24. As illustrated in FIG. 4, a position $(x_1, y_1)$ at which first camera 34*a* is installed is known, and a position $(x_2, y_2)$ at which second camera 34*b* is installed is also known. The optical axis of first camera 34*a* is fixed, and the optical axis of second camera 34*b* is also fixed. Accordingly, a direction (angle $\theta_1$) in which operator 50*a* is located with respect to first camera 34*a* can be calculated from the position of operator 50*a* in the image captured by first camera 34*a*. Similarly, a direction (angle θ2) in which operator 50*a* is located with respect to second camera 34*b* can be calculated from the position of operator 50*a* in the image captured by second camera 34*b*. Since the position $(x_1, y_1)$ of first camera 34*a* and the position $(x_2, y_2)$ of second camera 34*b* are known and the angle $\theta_1$ and the angle $\theta_2$ are calculated, a position $(x_3, y_3)$ of operator 50*a* can be calculated. Here, since a position $(x_4, y_4)$ of a front center of production facility 22 and a position $(x_5, y_5)$ of a front center of production facility 24 are also known, a distance $1_1$ between operator 50*a* and production facility 22 and a distance 12 between operator 50*a* and production facility 24 can be calculated. In S30, the distance between the operator selected in S28 and each of production facilities 12 to 28 is calculated in the procedure described above. As is clear from the above description, the distance calculated in S30 means a distance when production facilities 12 to 28 and operators 50*a* to 50*c* are viewed in plan view. In a case where feeder rack 32 is recognized in S24, a distance between the operator and feeder rack 32 is also calculated. Since a position of feeder rack 32 can be calculated similarly to the operator, the distance between feeder rack 32 and the operator can also be calculated.

In S30, image processing device 36 associates the operator selected in S28 with the production facility (feeder rack 32 in some cases) having the closest distance to the operator (S32). That is, since the distance between the operator and each of production facilities 12 to 28 is calculated in S30, the production facility having the smallest distance among the calculated distances is associated with the operator selected in S28. For example, in the case illustrated in FIG. 4, operator 50*a* and production facility (first board visual inspection machine) 22 are associated with each other.

Next, image processing device 36 determines whether the processing of S28 to S32 is executed for all the operators recognized in S24 (S34). In a case where the processing is not executed for all the operators recognized in S24 (NO in S34), the processing returns to S28 to execute the processing from S28. Accordingly, the distances to production facilities 12 to 28 are calculated for all the operators recognized in S24, and the production facility having the smallest distance is associated with each operator.

In a case where the processing is executed for all the operators recognized in S24 (YES in S34), the processing proceeds to S36. In S36, image processing device 36 determines whether all the image data that are the targets of the image processing in the moving image data input in S14 are processed. In a case where all the image data are not processed (NO in S36), image processing device 36 returns to S22 and repeats the processing from S22. Accordingly, all the image data that are the targets of the image processing in the moving image data input in S14 are processed.

In a case where all the image data are processed (YES in S36), image processing device 36 selects one operator who is the analysis target (S38). In the present example, each of three operators 50*a* to 50*c* disposed in the component mounting line is the analysis target. Then, in S38, one (for example, operator 50*a*) is selected from among three operators 50*a* to 50*c*.

Next, image processing device 36 determines whether the operator selected in S38 has a period in which the operator is associated continuously with same production facilities 12 to 28 and 32 for time equal to or longer than predetermined time in a period in which the moving image is captured by imaging devices (34*a* and 34*b*) (S40). That is, by the processing of S22 to S36, all the image data that are the analysis targets in the moving image data input in S14 are subjected to the image processing, and operators 50*a* to 50*c* are associated with any one of production facilities 12 to 28 and 32 at time when each image data is captured (note that, in a case where the operator is not shown in the image data (that is, in a case where the operator is not recognized), the operator is not associated with any of production facilities 12 to 28 and 32 at that time). In a case where the operator and the production facility are associated with each other, it can be determined that the operator is located in the vicinity of the production facility and performs any work on the production facility. However, there is a case where, even when the operator is located in the vicinity of any one of the production facilities at certain time, the operator simply passes in front of the production facility and does not perform the work on the production facility. In the present example, in a case where the operator is associated continuously with the same production facility for time equal to or longer than the predetermined time (for example, 20 seconds), it is determined that the operator performs the work on the production facility. Therefore, in S40, it is determined whether the operator has the period in which the operator is associated continuously with same production facilities 12 to 28 and 32 for time equal to or longer than the predetermined time.

The determination in S40 can be performed based on the time interval of the image data selected in S22. For example, in a case where the time interval of the image data selected in S22 is 5 seconds and the predetermined time used for the determination in S40 is 20 seconds, when the operator is associated continuously over 5 image data with the same production facility, it can be determined that the operator has the period in which the operator is associated continuously with the same production facility for time equal to or longer than the predetermined time. From a viewpoint of reducing a processing amount of the image processing, the time interval of the image data selected in S22 may be matched with the predetermined time used for the determination in S40. In this case, in a case where the operator is associated continuously over 2 image data with the same production facility, it can be determined that the operator has the period in which the operator is associated continuously with the same production facility for time equal to or longer than the predetermined time.

In a case where the operator does not have the period in which the operator is associated continuously with the same production facility for time equal to or longer than the predetermined time (NO in S40), it is determined that the operator does not perform the work on any of production facilities 12 to 28 and 32, and the result of association between the operator and the production facility is reset (S44). On the other hand, in a case where the operator has the period in which the operator is associated continuously with the same production facility for time equal to or longer than the predetermined time (YES in S40), it is approved that the operator performs the work on the production facility in the period, and the result of association between the operator and the production facility is maintained (S42). In a period other than the period in which the operator is associated continuously with the same production facility for time equal to or longer than the predetermined time, it is determined that the operator does not perform the work on any of production facilities 12 to 28 and 32, and the result of association between the operator and the production facility is reset.

Next, image processing device 36 determines whether the processing of S40 to S44 is executed for all the operators who are the analysis targets (S46). In a case where the processing is not executed for all the operators who are the analysis targets (NO in S46), the processing returns to S38 and the processing from S38 is executed. Accordingly, the processing of S40 to S44 is executed for all the operators who are the analysis targets, and which production facility the operator performs the work on is determined.

When S46 ends, the processing returns to S20 of FIG. 2, and image processing device 36 displays a time chart in which operators 50*a* to 50*c* who are the analysis targets are associated with each of production facilities 12 to 28 and 32 on display device 38 (S20). That is, at each time in the period (production period) in which the moving image is captured by imaging devices (34*a* and 34*b*), the time chart in which the work status indicating which production facility operators 50*a* to 50*c* performs the work on is visualized is displayed on display device 38. Since image processing device 36 acquires the operation status of each of production facilities 12 to 28 in S16, the operation status of each of production facilities 12 to 28 may be also displayed in the time chart displayed in S20. By also displaying the operation status of each of production facilities 12 to 28, it is possible to estimate the content of the work performed by operators 50*a* to 50*c* on each of production facilities 12 to 28. For example, in a state where the operator performs the work on first component mounting machine 18 and first component mounting machine 18 issues a warning of component shortage, it can be estimated that the worker performs the work of replenishing the component.

Here, an example of the time chart displayed on display device 38 in S20 will be described with reference to FIGS. 5 and 6.

Figure 5:
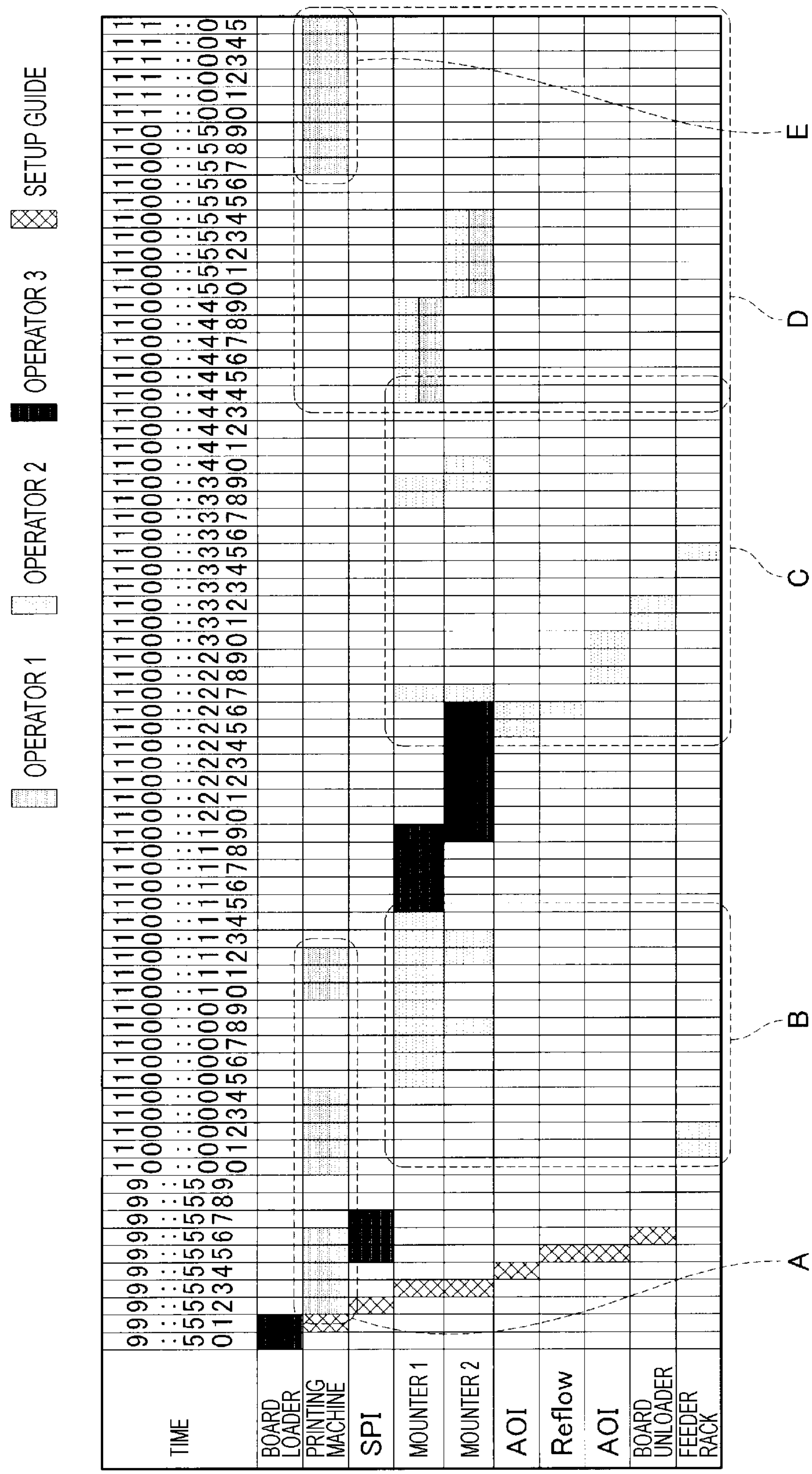
FIG. 5 is a diagram illustrating a first example of a time chart in which a work status of the operator is visualized.

FIG. 5 is a time chart illustrating the work statuses of operators 50*a* to 50*c* for production facilities 12 to 28 and 32 from time 9:50 to time 11:05. The work status of operator 50*a* is displayed as an "operator 1" in the drawing, the work status of operator 50*b* is displayed as an "operator 2" in the drawing, and the work status of operator 50*c* is displayed as an "operator 3" in the drawing.

In FIG. 5, as the work statuses of operators 50*a* to 50*c*, it is displayed that which production facility the work is performed on, every minute. For example, in the column of 9:50, it is displayed that which production facility the operator performs the work on from 9:50:00 to 9:51:00. In the present example, in the work for production facilities 12 to 28 and 32, when the operator is associated continuously with the production facility for time equal to or longer than 20 seconds, it is determined that the operator performs the work for the production facility. Therefore, there is a case where the work is performed on multiple production facilities in one minute. For example, operator 50*b* (operator 2) performs the work on both first component mounting machine 18 and second component mounting machine 20 at 10:08.

Further, in FIG. 5, the operation statuses of production facilities 12 to 28 are also illustrated. Specifically, a guide of the setup work is output at time 9:51 in printing machine 14, and similarly, the guide (alarm) of each setup work is output at time 9:52 in print inspection machine (SPI) 16, at time 9:53 in first component mounting machine 18 and second component mounting machine 20, at time 9:54 in first board visual inspection machine (AOI) 22, at time 9:55 in reflow oven 24 and second board visual inspection machine (AOI) 26, and at time 9:56 in board unloader 28. Accordingly, the time chart of FIG. 5 is a time chart when the guide of the setup work is output to production facilities 12 to 28 and operators 50*a* to 50*c* perform the setup work on each of production facilities 12 to 28 in accordance with the guide.

From the time chart illustrated in FIG. 5, it is understood that specific measures for improving the work statuses of operators 50*a* to 50*c* are required. For example, as illustrated in A of FIG. 5, operator 50*a* (operator 1) takes long time for the setup of printing machine 14. Therefore, it is understood that measures, such as preparing the solder in advance or preparing the exchange mask in advance, are required to shorten the time required for operator 50*a* to perform the setup work on printing machine 14.

As illustrated in B of FIG. 5, in first component mounting machine 18 and second component mounting machine 20, it takes long time until operator 50*b* (operator 2) actually starts the work after the guide of the setup work is output. Therefore, it is understood that, for example, measures, such as preparing feeder rack 32 in advance, are required to shorten the time until operator 50*b* starts the work.

Further, as illustrated in C of FIG. 5, the work load of operator 50*b* (the operator 2) is high in this time zone, and operator 50*b* performs the work on multiple production facilities 18 to 28 and 32. On the other hand, in this time zone, operator 50*c* (operator 3) does not perform the work. Accordingly, it is understood that measures, such as sharing the work with another operator 50*c*, are required to reduce the work load of operator 50*b*.

In addition, as illustrated in D and E of FIG. 5, since operator 50*a* (operator 1) and operator 50*b* (operator 2) cooperate with each other to perform the work on first component mounting machine 18 and second component mounting machine 20 from time 10:44 to time 10:54, the work of operator 50*a* for printing machine 14 is delayed from time 10:57. Accordingly, it is understood that the work of operator 50*a* for printing machine 14 can be promptly started by changing the work such that operator 50*b* and operator 50*c* (the operator 3) cooperate with each other to perform the work on first component mounting machine 18 and second component mounting machine 20.

Figure 6:
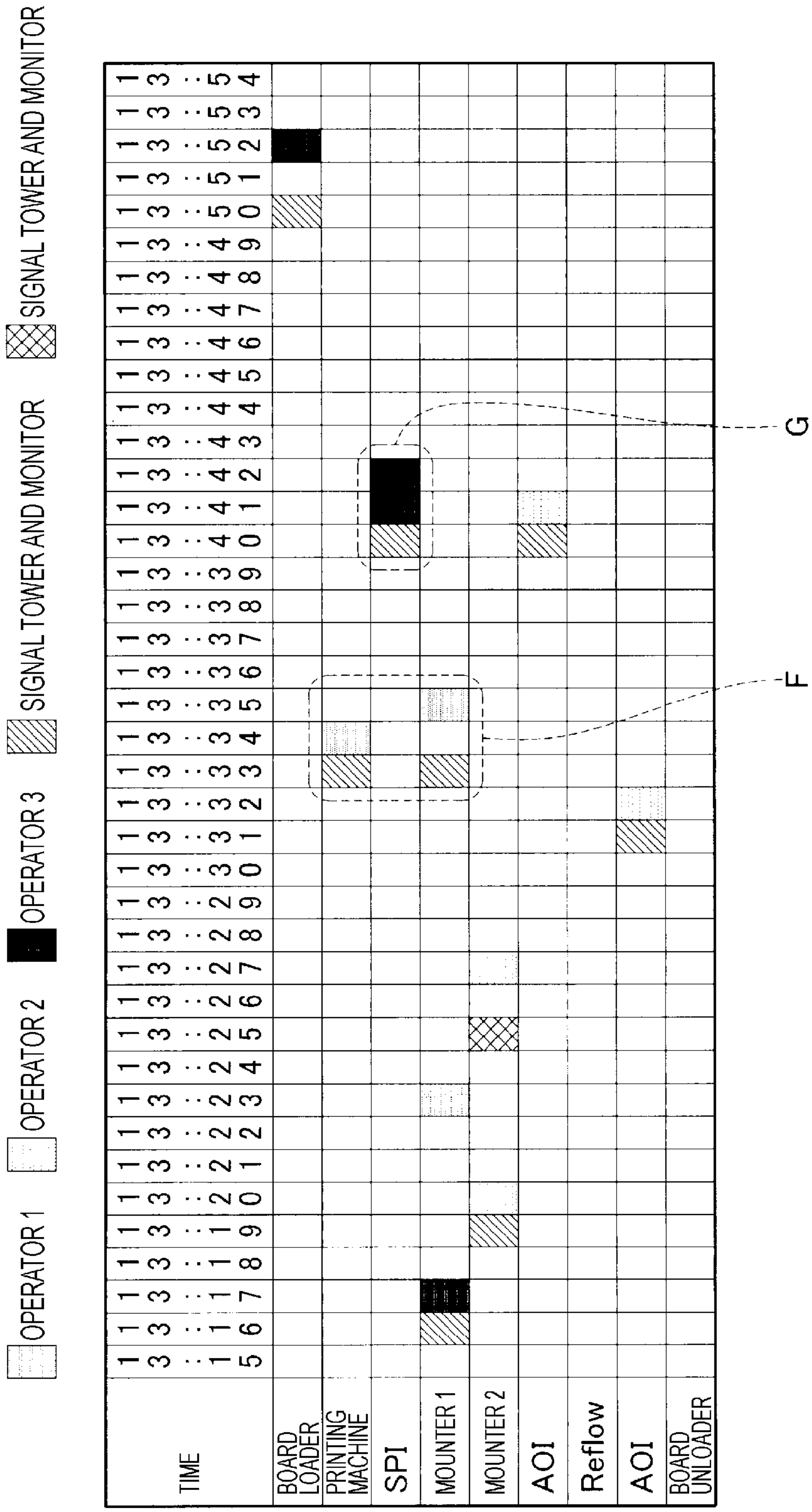
FIG. 6 is a diagram illustrating a second example of the time chart in which the work status of the operator is visualized.

FIG. 6 is a time chart illustrating the work statuses of operators 50*a* to 50*c* for production facilities 12 to 28 and 32 from time 13:15 to time 13:54. In FIG. 6, the operation statuses of production facilities 12 to 28 (specifically, display by a signal tower or a monitor) are also illustrated. As is clear from FIG. 6, in the time chart of FIG. 6, the display (alarm) by the signal tower or the monitor is output from the production facility, and the work statuses of operators 50*a* to 50*c* for responding to the display are illustrated.

Also from the time chart illustrated in FIG. 6, it is possible to derive the measures for improving the work statuses of operators 50*a* to 50*c*. For example, as illustrated in F of FIG. 6, since the alarm is simultaneously generated in printing machine 14 and first component mounting machine 18 at time 13:33, it is indicated that the work of operator 50*a* (operator 1) for first component mounting machine 18 is delayed. Accordingly, in a case where the alarm is simultaneously generated in the multiple production facilities, it is understood that it is required for the multiple operators to respond to the alarm. In the example described above, operators 50*b* and 50*c* (operators 2 and 3) need only be changed to perform the work on first component mounting machine 18.

As illustrated in G of FIG. 6, it takes, as the work time, about two minutes for operator 50*c* (operator 3) to complete the work after the alarm is generated in print inspection machine (SPI) 16. Therefore, there is a possibility that operator 50*c* is not familiar with handling of print inspection machine 16. Therefore, as the measures, measures, such as standardization (manualization) of the work of print inspection machine 16 and education to operator 50*c* are considered.

As described above, in component mounting system 10 of the present example, multiple production facilities 12 to 28 and 32 and multiple operators 50*a* to 50*c* disposed in the component mounting line are imaged, and the work statuses of operators 50*a* to 50*c* are visualized by performing the image processing on the captured moving image. Therefore, it is possible to evaluate whether the work of operators 50*a* to 50*c* is appropriate for the operation statuses of multiple production facilities 12 to 28 and 32 installed in the component mounting system. Further, in a case where the work of operators 50*a* to 50*c* is not appropriate, it is possible to easily estimate the cause thereof, and as a result, it is also possible to find improvement measures.

Although the specific example of the technique disclosed in the present description is described in detail, the specific example is merely an example, and does not limit the claims. The technique claimed in the claims includes various modifications and alterations of the specific example described above.

For example, in the example described above, each of production facilities 12 to 28 outputs the state information indicating their own states, management device 30 acquires the operation status of each of production facilities 12 to 28 from the output state information, and the acquired operation status is input to image processing device 36. However, the technique disclosed in the present description is not limited to such a form. For example, image processing device 36 may acquire the operation status of each production facility by performing the image processing on the moving image data captured by the imaging devices. That is, the operation status of each production facility may be acquired from the guide of the signal tower or the monitor disposed in each production facility by performing the image processing on the moving image data. In this case, since it is not required to acquire the operation status from management device 30, the system configuration can be simplified.

In addition, in the example described above, a producer who produces the circuit board in the component mounting line and a person who visualizes the work status of the worker in image processing device 36 are the same person, but the technique disclosed in the present description is not limited to such a form. For example, the producer who produces the circuit board in the component mounting line and the person who visualizes the work status of the worker in image processing device 36 may be different persons. In this case, the producer who produces the circuit board in the component mounting line only performs, for example, the registration of the reference image of the production facility or the operator that is the target of the image processing, and the input of the moving image data obtained by imaging the component mounting line. The registration of the reference image and the input of the moving image can be performed from PC or tablet PC owned by the producer. On the other hand, the person who visualizes the work status of the worker by image processing device 36 analyzes the registered reference image and the input moving image data, and outputs the time chart in which the work status of the worker is visualized to the producer. With such a form, the worker of image processing device 36 can support the producer who produces the circuit board in the component mounting line from a remote place.

In addition, in the example described above, although it is determined only whether operators 50*a* to 50*c* perform the work on each of production facilities 12 to 28 and 32, the technique disclosed in the present description is not limited to such a form. For example, the image processing device may estimate (determine) the content of the work from the operation status of the production facility on which the operator performs the work. Since the image processing device estimates the content of the work of the operator, the user can easily evaluate the work status of the operator. Further, the image processing device may determine whether there is the delay in the work of the operator from transition of the operation status of the production facility and transition of the work status of the operator. With such a configuration, it is possible to easily grasp the delay in the work of the operator, and it is possible to improve the convenience for the producer who produces the circuit board in the component mounting line.

In addition, in the example described above, operators 50*a* to 50*c* are always associated with the production facility having the closest distance to the operator, but the technique disclosed in the present description is not limited to such a form. For example, in a case where the distance between the operator and the production facility having the closest distance to the operator is longer than the predetermined distance, the operator need not be associated with the production facility. That is, the operator is not associated with any production facility. This is because, in a case where the distance from the operator to the production facility exceeds the predetermined distance, it is difficult to consider that the operator performs the work on the production facility.

In addition, in the example described above, all the production facilities installed in the component mounting line and all the operators disposed in the component mounting line are the analysis targets, but the technique disclosed in the present description is not limited to such a form. For example, only the work status of a specific operator for a specific production facility may be the analysis target.

Further, in the example described above, the positions of operators 50*a* to 50*c* are calculated by imaging operators 50*a* to 50*c* with two cameras 34*a* and 34*b*, but the technique disclosed in the present description is not limited to such a form. For example, one camera and a distance sensor (laser sensor) that measures the distance to the operator may be installed, and the position of the operator may be calculated by using the image of the camera and the distance measured by the distance sensor.

In the example described above, the image captured by the camera is used to calculate the position of the operator, but the position of the operator may be acquired by having the operator carry a GPS sensor. In this case, it is not always required to image the production facility installed in the component mounting line, and the work status of the operator may be estimated only from the position of the operator.

In addition, the technical elements described in the present description or the drawings exhibit technical usefulness alone or in various combinations, and are not limited to the combinations recited in the claims as originally filed. In addition, the technique described in the present description or the drawings simultaneously achieves multiple purposes, and has technical usefulness with achieving one purpose itself of the multiple purposes.

The invention claimed is:

1. A component mounting system comprising:

multiple production facilities installed in a component mounting line for mounting a component on a board;

imaging circuitry installed in the component mounting line and configured to image the multiple production facilities and one or multiple workers disposed in the component mounting line;

operation status acquisition circuitry configured to acquire an operation status of at least one of the multiple production facilities in each of a plurality of points in time or a plurality of periods set in advance in a predetermined production period in which a product is produced in the component mounting line; and display circuitry configured to perform image processing on an image captured by the imaging circuitry in the predetermined production period, to visualize and display, for at least one of the one or multiple workers, a work status of the worker for at least one of the multiple production facilities in each of the plurality of points in time or the plurality of periods, and to display the acquired operation status of the at least one of the multiple production facilities in association with the work status, wherein the image processing includes:

calculating a distance between the worker and each of the multiple production facilities when the multiple production facilities are imaged in a vicinity of the worker;

determining the work status based on a production facility of the multiple production facilities having a smallest calculated distance; and in a case where it is determined that the worker performs work for the production facility having the smallest calculated distance:

discarding the determination that the worker performs the work for the production facility when a time during which the work is performed for the production facility is shorter than a predetermined time; and maintaining the determination that the worker performs the work for the production facility when the time during which the work is performed for the production facility is equal to or longer than the predetermined time.

2. The component mounting system according to claim 1, wherein the operation status acquisition circuitry is further configured to acquire the operation status by the image processing.

3. The component mounting system according to claim 1, wherein the at least one of the multiple production facilities includes state output circuitry configured to output own state of the production facility, and the operation status acquisition circuitry is further configured to acquire the operation status from the state output from the state output circuitry.

4. The component mounting system according to claim 1, further comprising:

determination circuitry configured to determine whether there is delay in work of the worker based on a change of the operation status of the production facility and a change of the work status of the worker.

5. The component mounting system according to claim 1, further comprising:

first designation circuitry configured to designate a production facility that is an analysis target from among the multiple production facilities, wherein the operation status acquisition circuitry is further configured to acquire an operation status of the production facility designated by the first designation circuitry.

6. The component mounting system according to claim 1, further comprising:

second designation circuitry configured to designate a worker that is an analysis target from among the one or multiple workers, wherein the display circuitry is further configured to visualize and display a work status of the worker designated by the second designation circuitry.

7. The component mounting system according to claim 1, wherein, in the image processing, in a case where it is determined that the worker performs work for a specific production facility, a content of the work performed on the production facility by the worker is specified based on an operation status of the specific production facility.

8. An image processing device comprising:

image input circuitry configured to input an image obtained by imaging multiple production facilities installed in a component mounting line for mounting a component on a board and one or multiple workers disposed in the component mounting line in a predetermined production period in which a product is produced in the component mounting line;

operation status acquisition circuitry configured to acquire an operation status of at least one of the multiple production facilities in each of a plurality of points in time or a plurality of periods set in advance in the predetermined production period; and image processing circuitry configured to perform image processing on the image input from the image input circuitry, to visualize, for at least one of the one or multiple workers, a work status of the worker for at least one of the multiple production facilities in each of the plurality of points in time or the plurality of periods, and to display the acquired operation status of the at least one of the multiple production facilities in association with the work status, wherein the image processing includes:

calculating a distance between the worker and each of the multiple production facilities when the multiple production facilities are imaged in a vicinity of the worker;

determining the work status based on a production facility of the multiple production facilities having a smallest calculated distance; and in a case where it is determined that the worker performs work for the production facility having the smallest calculated distance:

discarding the determination that the worker performs the work for the production facility when a time during which the work is performed for the production facility is shorter than a predetermined time; and maintaining the determination that the worker performs the work for the production facility when the time during which the work is performed for the production facility is equal to or longer than the predetermined time.

9. An image processing method comprising:

an image capturing step of imaging multiple production facilities installed in a component mounting line for mounting a component on a board and one or multiple workers disposed in the component mounting line in a predetermined production period in which a product is produced in the component mounting line;

an operation status acquisition step of acquiring an operation status of at least one of the multiple production facilities in each of a plurality of points in time or a plurality of periods set in advance in the predetermined production period; and an image processing step of performing image processing on an image captured in the image capturing step, to visualize, for at least one of the one or multiple workers, a work status of the worker for at least one of the multiple production facilities in each of the plurality of points in time or the plurality of periods, and to display the acquired operation status of the at least one of the multiple production facilities in association with the work status, wherein the image processing includes:

calculating a distance between the worker and each of the multiple production facilities when the multiple production facilities are imaged in a vicinity of the worker;

determining the work status based on a production facility of the multiple production facilities having a smallest calculated distance; and in a case where it is determined that the worker performs work for the production facility having the smallest calculated distance:

discarding the determination that the worker performs the work for the production facility when a time during which the work is performed for the production facility is shorter than a predetermined time; and maintaining the determination that the worker performs the work for the production facility when the time during which the work is performed for the production facility is equal to or longer than the predetermined time.

10. A non-transitory computer-readable medium storing instructions for causing a computer to execute:

an image capturing step of imaging multiple production facilities installed in a component mounting line for mounting a component on a board and one or multiple workers disposed in the component mounting line in a predetermined production period in which a product is produced in the component mounting line;

an operation status acquisition step of acquiring an operation status of at least one of the multiple production facilities in each of a plurality of points in time or a plurality of periods set in advance in the predetermined production period; and an image processing step of performing image processing on an image captured in the image capturing step, to visualize, for at least one of the one or multiple workers, a work status of the worker for at least one of the multiple production facilities in each of the plurality of points in time or the plurality of periods, and to display the acquired operation status of the at least one of the multiple production facilities in association with the work status, wherein the image processing includes;

calculating a distance between the worker and each of the multiple production facilities when the multiple production facilities are imaged in a vicinity of the worker;

determining the work status based on a production facility of the multiple production facilities having a smallest calculated distance; and in a case where it is determined that the worker performs work for the production facility having the smallest calculated distance:

discarding the determination that the worker performs the work for the production facility when a time during which the work is performed for the production facility is shorter than a predetermined time; and maintaining the determination that the worker performs the work for the production facility when the time during which the work is performed for the production facility is equal to or longer than the predetermined time.

11. An image processing system comprising:

input circuitry configured to input an image obtained by imaging multiple production facilities installed in a component mounting line for mounting a component on a board and one or multiple workers disposed in the component mounting line in a predetermined production period in which a product is produced in the component mounting line;

operation status acquisition circuitry configured to acquire an operation status of at least one of the multiple production facilities in each of a plurality of points in time or a plurality of periods set in advance in the predetermined production period; and image processing circuitry communicably connected to the input circuitry and configured to perform image processing on the image input from the input circuitry, to visualize, for at least one of the one or multiple workers, a work status of the worker for at least one of the multiple production facilities in each of the plurality of points in time or the plurality of periods, and to display the acquired operation status of the at least one of the multiple production facilities in association with the work status, wherein the image processing includes:

calculating a distance between the worker and each of the multiple production facilities when the multiple production facilities are imaged in a vicinity of the worker;

determining the work status based on a production facility of the multiple production facilities having a smallest calculated distance; and in a case where it is determined that the worker performs work for the production facility having the smallest calculated distance:

discarding the determination that the worker performs the work for the production facility when a time during which the work is performed for the production facility is shorter than a predetermined time; and maintaining the determination that the worker performs the work for the production facility when the time during which the work is performed for the production facility is equal to or longer than the predetermined time.

* * * * *